(12) United States Patent
Nagatomo et al.

(10) Patent No.: US 10,685,848 B2
(45) Date of Patent: Jun. 16, 2020

(54) WORKPIECE PROCESSING METHOD

(71) Applicant: TOKYO ELECTRON LIMITED, Tokyo (JP)

(72) Inventors: Yu Nagatomo, Miyagi (JP); Yoshihide Kihara, Miyagi (JP)

(73) Assignee: TOKYO ELECTON LIMITED, Tokyo (JP)

( * ) Notice: Subject to any disclaimer, the term of this patent is extended or adjusted under 35 U.S.C. 154(b) by 0 days.

(21) Appl. No.: 16/127,468

(22) Filed: Sep. 11, 2018

(65) Prior Publication Data
US 2019/0080929 A1 Mar. 14, 2019

(30) Foreign Application Priority Data

Sep. 12, 2017 (JP) .................................. 2017-174957

(51) Int. Cl.
*H01L 21/3213* (2006.01)
*H01L 21/285* (2006.01)

(52) U.S. Cl.
CPC .. *H01L 21/32136* (2013.01); *H01L 21/28562* (2013.01)

(58) Field of Classification Search
None
See application file for complete search history.

(56) References Cited

U.S. PATENT DOCUMENTS

| | | | |
|---|---|---|---|
| 2004/0142557 A1* | 7/2004 | Levy | C23C 16/0272 438/680 |
| 2004/0202786 A1* | 10/2004 | Wongsenakhum | C23C 16/0281 427/250 |
| 2015/0104957 A1* | 4/2015 | Takachi | H01L 21/0273 438/798 |
| 2015/0187602 A1* | 7/2015 | Kim | H01L 21/0337 428/195.1 |
| 2016/0099131 A1* | 4/2016 | Kihara | H01J 7/3244 216/41 |
| 2016/0099148 A1* | 4/2016 | Kihara | H01L 21/0338 438/695 |
| 2017/0098528 A1* | 4/2017 | Kihara | H01J 37/32082 |

FOREIGN PATENT DOCUMENTS

JP 2011-82560 A 4/2011

* cited by examiner

*Primary Examiner* — Michelle Mandala
*Assistant Examiner* — Jordan M Klein
(74) *Attorney, Agent, or Firm* — Rothwell, Figg, Ernst & Manbeck, P.C.

(57) ABSTRACT

In a method of an embodiment, a tungsten film is formed on a workpiece. The workpiece includes an underlying film and a mask provided on the underlying film. The tungsten film has a first region extending along the side wall surface of the mask that defines an opening, and a second region extending on the underlying film. Subsequently, the tungsten film is plasma-etched while leaving the first region. In forming the tungsten film, a precursor gas containing tungsten is supplied to the workpiece. Then, plasma of hydrogen gas is generated in order to supply hydrogen active species to the precursor on the workpiece.

6 Claims, 12 Drawing Sheets

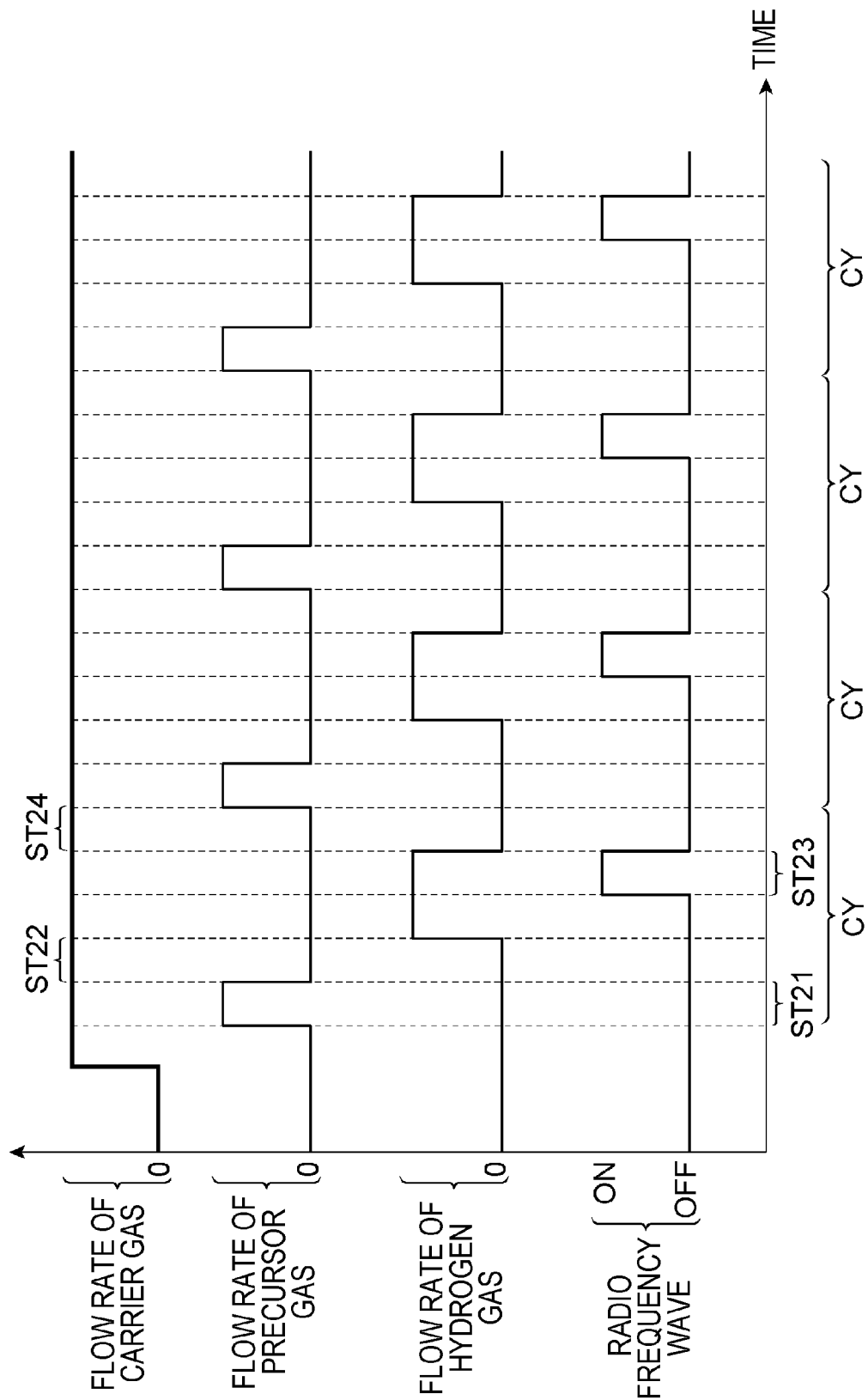

of a workpiece that is an example to which the method illustrated in FIG. 1 is applicable.

WORKPIECE PROCESSING METHOD

CROSS-REFERENCE TO RELATED APPLICATIONS

This application is based on and claims priority from Japanese Patent Application No. 2017-174957, filed on Sep. 12, 2017, with the Japan Patent Office, the disclosure of which is incorporated herein in its entirety by reference.

TECHNICAL FIELD

The present disclosure relates to a workpiece processing method.

BACKGROUND

In manufacturing an electronic device, a plasma etching is performed to transfer a pattern of a mask to an underlying film. As for the mask, a resist mask is generally used. The resist mask is formed by a photolithography technique. Accordingly, the critical dimension of the pattern formed in the layer to be etched relies on the resolution limit of the resist mask formed by the photolithography technique.

In recent years, with the high integration of an electronic device, there has been a demand for forming a pattern having a dimension smaller than the resolution limit of the resist mask. Thus, a technique has been suggested which adjusts a width of an opening defined by the resist mask by depositing a silicon oxide film on the resist mask. Japanese Patent Laid-Open Publication No. 2011-082560 discloses this technique.

In the technique disclosed in Japanese Patent Laid-Open Publication No. 2011-082560, the silicon oxide film is formed on the resist mask according to an atomic layer deposition (ALD) method. Specifically, aminosilane gas and activated oxygen species are alternately supplied to a workpiece having the resist mask.

SUMMARY

In an aspect, the present disclosure provides a workpiece processing method. The workpiece includes an underlying film and a mask. The mask is provided on the underlying film. The mask provides an opening. This method includes: (i) forming a tungsten film on the workpiece such that the tungsten film includes a first region extending along a side wall surface of the mask that defines the opening, and a second region extending on the underlying film; and (ii) performing a plasma etching of the tungsten film to remove the second region while leaving the first region. The forming the tungsten film includes: (iii) supplying a tungsten-containing precursor gas to the workpiece in order to deposit a tungsten-containing precursor on the workpiece; and (iv) generating plasma from hydrogen gas in order to supply hydrogen active species to the precursor on the workpiece.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a timing chart for a processing of forming a tungsten film.

DETAILED DESCRIPTION

Figure 1:
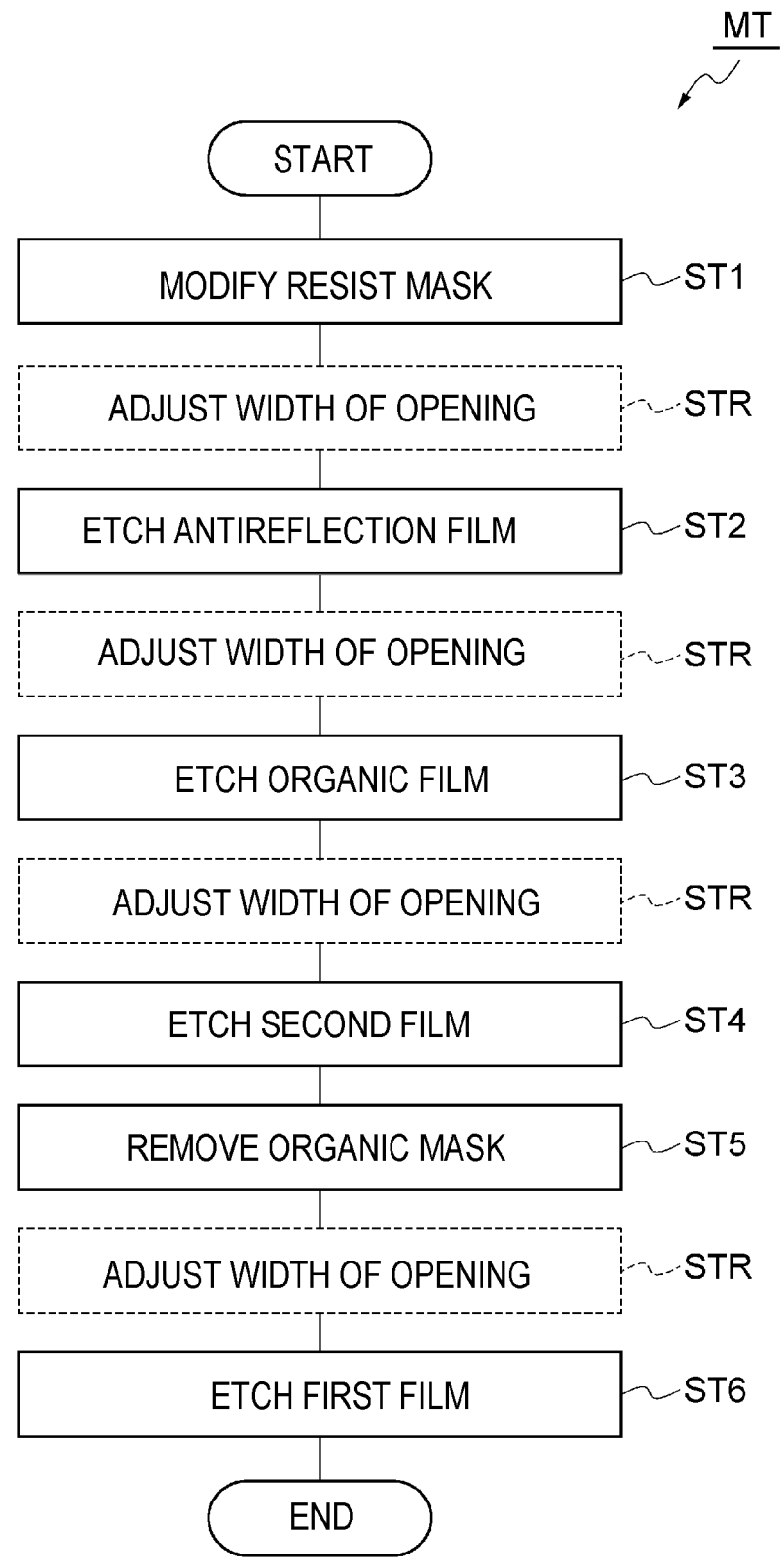
FIG. 1 is a flowchart illustrating a workpiece processing method according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a plasma etching, it is required to form an opening with a high aspect ratio in a film and/or form a deep opening in a film. Thus, it is required to provide a mask which is more rigid against the plasma etching, in addition to adjusting the width of the opening of the mask.

In an aspect, the present disclosure provides a workpiece processing method. The workpiece includes an underlying film and a mask. The mask is provided on the underlying film. The mask provides an opening. This method includes: (i) forming a tungsten film on the workpiece such that the tungsten film includes a first region extending along a side wall surface of the mask that defines the opening, and a second region extending on the underlying film; and (ii) performing a plasma etching of the tungsten film to remove the second region while leaving the first region. The forming the tungsten film includes: (iii) supplying a tungsten-containing precursor gas to the workpiece in order to deposit a tungsten-containing precursor on the workpiece; and (iv) generating plasma from hydrogen gas in order to supply hydrogen active species to the precursor on the workpiece.

In the method according to the aspect, the precursor is deposited and impurities in the precursor are removed by active species of hydrogen, so that the tungsten film is formed on the surfaces of the mask and the underlying film. Then, the tungsten film is etched such that the first region is left. As a result, the width of the opening of the mask is adjusted. Further, since the first region made of tungsten is provided along the side wall surface of the mask, the mask which is more rigid against the plasma etching of the underlying film is provided. However, in forming a tungsten film according to an ALD method that does not use plasma, the temperature of the workpiece is generally set to 250° C. or higher in order to cause a reaction for removing the impurities in the precursor. Meanwhile, in the method according to the aspect, since the impurities in the precursor are removed by active species of hydrogen obtained from plasma of hydrogen gas so that the tungsten film is formed, the temperature of the workpiece during the performance of the processing of forming a tungsten film may be set to a low temperature.

According to an embodiment, in the forming a tungsten film, a cycle including the supplying a precursor gas and the generating plasma from hydrogen gas is performed multiple times.

In an embodiment, the precursor gas is tungsten halide gas. In an embodiment, the precursor gas may be tungsten hexafluoride gas.

In an embodiment, the method further includes: acquiring a measurement value of a width of an opening of a mask in each of a plurality of regions of the workpiece; calculating a positive difference value between the measurement value of the width of the opening in each of the plurality of regions and a reference value; and adjusting a temperature of each of the plurality of regions of the workpiece so as to form the tungsten film having a film thickness corresponding to the difference value for each of the plurality of regions of the workpiece in the forming a tungsten film. The forming a tungsten film is performed in a state where the temperature of each of the plurality of regions of the workpiece is adjusted.

In an embodiment, the workpiece includes a silicon-containing film, an organic film provided on the silicon-containing film, an antireflection film containing silicon and provided on the organic film, and a resist mask provided on the antireflection film. The silicon-containing film has a first film formed of silicon and a second film formed of silicon oxide and provided on the first film.

In an embodiment, the underlying film is the antireflection film, and the mask provided on the underlying film is the resist mask. In an embodiment, the method further includes: after the performing a tungsten film, performing a plasma etching of the antireflection film; performing a plasma etching of the organic film to form an organic mask from the organic film; performing a plasma etching of the second film; removing the organic mask; and performing a plasma etching of the first film.

In an embodiment, the underlying film is the first film, and the mask is a mask formed by the second film. In this embodiment, the method further includes: performing a plasma etching of the antireflection film; performing a plasma etching of the organic film to form an organic mask from the organic film; performing a plasma etching of the second film; removing the organic mask; and performing a plasma etching of the first film.

As described above, it is possible to adjust the width of the opening of the mask, and provide the mask which is more rigid against the plasma etching.

Hereinafter, various embodiments will be described in detail with reference to the drawings. In addition, in the respective drawings, similar or corresponding parts will be denoted by the same reference numeral.

FIG. 1 is a flowchart illustrating a workpiece processing method according to an embodiment. The method MT illustrated in FIG. 1 includes step STR of adjusting the width of the opening of the mask. Step STR is performed to adjust the width of the opening of the mask for a plasma etching in at least one of steps ST2, ST3, ST4, and ST6.

Figure 2:
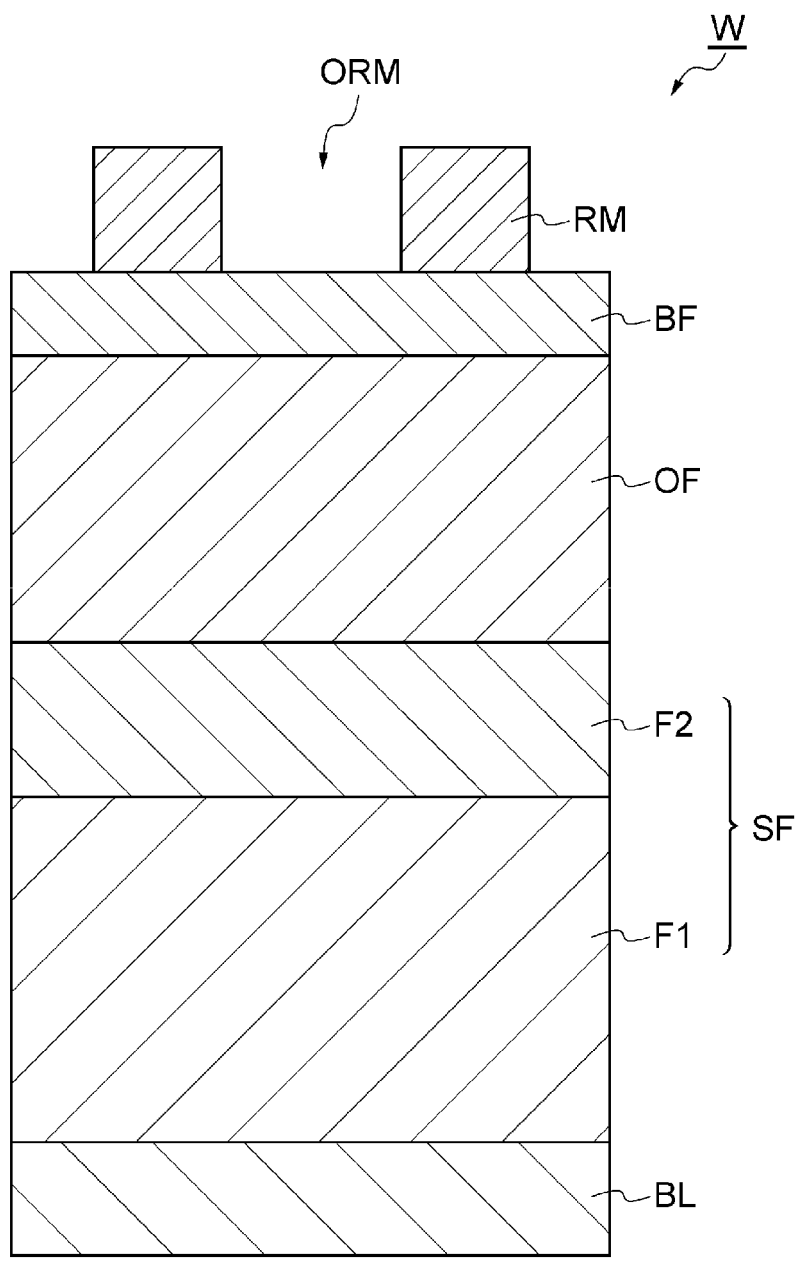
FIG. 2 is an enlarged cross-sectional view illustrating a portion of a workpiece that is an example to which the method illustrated in FIG. 1 is applicable.

FIG. 2 is an enlarged cross-sectional view illustrating a portion of the workpiece that is an example to which the method illustrated in FIG. 1 is applicable. The workpiece W illustrated in FIG. 2 may have a substantially disk shape. In an embodiment, the workpiece W includes a silicon-containing film SF, an organic film OF, an antireflection film BF, and a resist mask RM. The silicon-containing film SF is provided on a base layer BL. In an embodiment, the silicon-containing film SF includes first and second films F1 and F2. The first film F1 is provided on the base layer BL, and the second film F2 is provided on the first film F1. The first and second films F1 and F2 each contain silicon and are formed of different materials. The first film F1 is formed of, for example, silicon. The first film F1 may be a polycrystalline silicon film or an amorphous silicon film. The second film F2 is formed of, for example, silicon oxide.

The organic film OF is provided on the silicon-containing film SF. The antireflection film BF is provided on the organic film OF. The antireflection film BF contains silicon. The resist mask RM is provided on the antireflection film BF. The resist mask RM has a pattern to be transferred to the antireflection film BF by the plasma etching. That is, the resist mask RM provides an opening ORM. The opening ORM is a groove or a hole and partially exposes the surface of the antireflection film BF. The resist mask RM may be formed by patterning the resist film using the photolithography technique.

As illustrated in FIG. 1, the method MT includes steps ST1 to ST6 and STR. For the performance of steps ST1 to ST6 and STR, one or more plasma processing apparatuses are used. That is, steps ST1 to ST6 and STR may be performed using a single plasma processing apparatus. In addition, each of steps ST1 to ST6 and STR may be performed using a plasma processing apparatus different from plasma processing apparatuses used in the other steps. In addition, some of steps ST1 to ST6 and STR may be performed using one plasma processing apparatus, and one or more of the other steps may be performed using one or more other plasma processing apparatuses.

Figure 3:
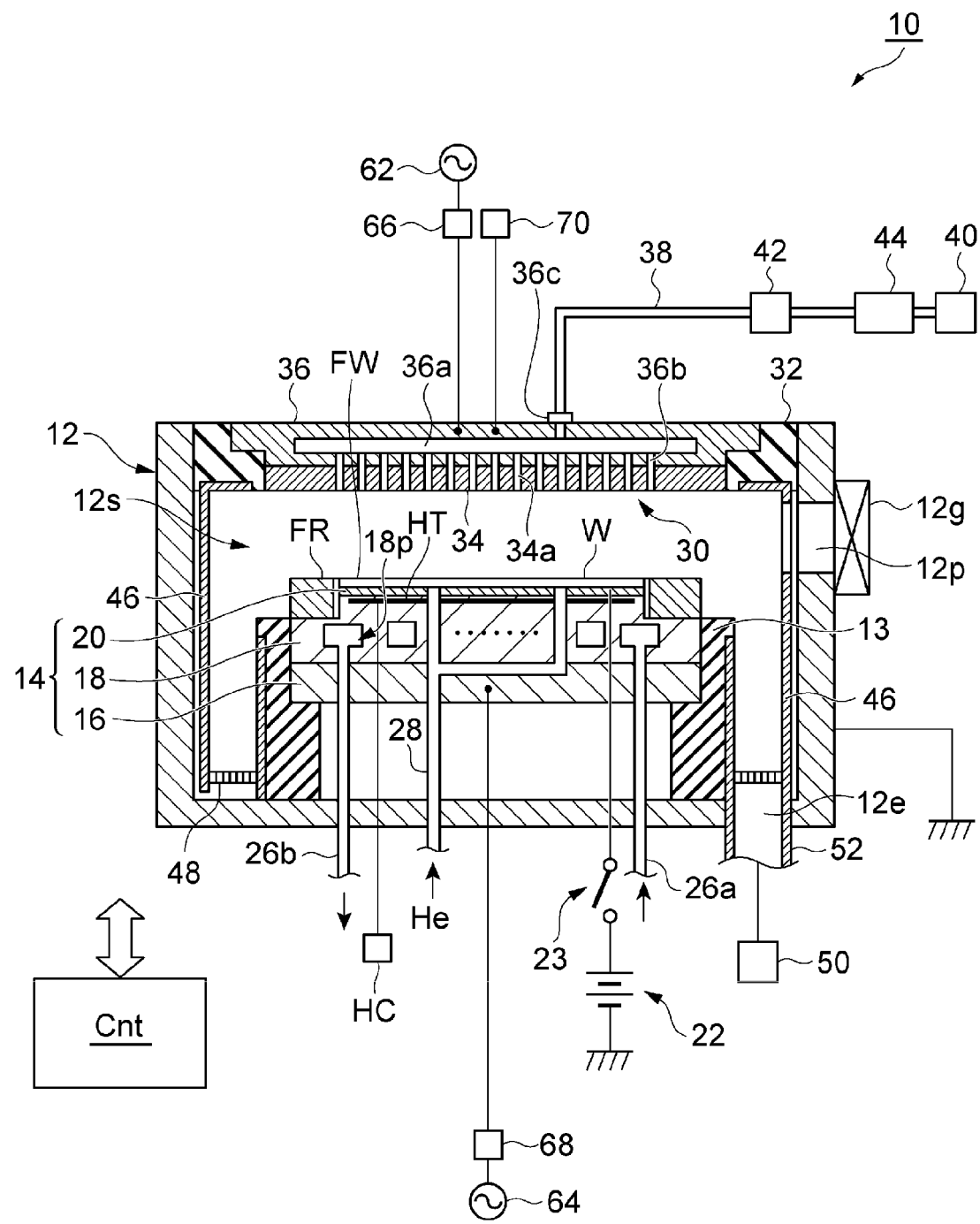
FIG. 3 is a view schematically illustrating a plasma processing apparatus that is usable for performing the method illustrated in FIG. 1.

FIG. 3 is a view schematically illustrating a plasma processing apparatus that is usable for performing the method illustrated in FIG. 1. A plasma processing apparatus 10 illustrated in FIG. 3 is a capacitively coupled plasma processing apparatus. The plasma processing apparatus 10 includes a chamber body 12. The chamber body 12 has a substantially cylindrical shape and provides an internal space 12s. The chamber body 12 is formed of, for example, aluminum. The inner wall surface of the chamber body 12 is anodized. The chamber body 12 is grounded.

A substantially cylindrical support 13 is provided on the bottom portion of the chamber body 12. The support 13 is formed of, for example, an insulating material. The insulating material of the support 13 is, for example, quartz. The support 13 extends perpendicularly from the bottom portion of the chamber body 12 inside the chamber body 12. A stage 14 is provided in the internal space of the chamber body 12. The stage 14 is supported by the support 13.

The stage 14 is configured to support a workpiece W placed thereon. The stage 14 includes an electrode plate 16, a lower electrode 18, and an electrostatic chuck 20. The electrode plate 16 and the lower electrode 18 are conductors, and may be formed of a metal such as aluminum. The electrode plate 16 and the lower electrode 18 each have a substantially disk shape. The lower electrode 18 is provided on the electrode plate 16, and electrically connected to the electrode plate 16.

The electrostatic chuck 20 is provided on the lower electrode 18. The electrostatic chuck 20 has a structure where an electrode which is a conductive film is disposed between a pair of insulating layers or sheets. A DC power supply 22 is electrically connected to the electrode of the electrostatic chuck 20 via a switch 23. When a voltage is applied from the DC power supply 22 to the electrostatic chuck 20 in a state where the workpiece W is placed on the electrostatic chuck 20, an electrostatic attraction is generated between the workpiece W and the electrostatic chuck 20. The workpiece W is held on the electrostatic chuck 20 by the generated electrostatic attraction.

A focus ring FR is disposed on the peripheral edge portion of the stage 14 to surround the edge of the workpiece W and the electrostatic chuck 20. The focus ring FR is provided to improve the uniformity of the plasma processing. The focus ring FR may be formed of, for example, a silicon-containing material.

A flow path 18p is provided inside the lower electrode 18. The flow path 18p may extend in a spiral form around the central axis of the stage 14. A refrigerant is supplied to the flow path 18p from a chiller unit provided outside the chamber body 12 via a pipe 26a. The refrigerant supplied to the flow path 18p returns to the chiller unit via a pipe 26b. That is, the refrigerant circulates between the flow path 18p and the chiller unit. By controlling the temperature of the refrigerant, the temperature of the workpiece W mounted on the electrostatic chuck 20 is controlled.

The plasma processing apparatus 10 is provided with a gas supply line 28. The gas supply line 28 supplies a heat transfer gas, for example, He gas from a heat transfer gas supply mechanism to the space between the top surface of the electrostatic chuck 20 and the rear surface of the workpiece W.

The plasma processing apparatus 10 is provided with a temperature adjustment unit HT that adjusts the temperature of the workpiece W. The temperature adjustment unit HT is provided inside the electrostatic chuck 20. A heater controller HC is connected to the temperature adjustment unit HT. When a power is supplied from the heater controller HC to the temperature adjustment unit HT, the temperature of the electrostatic chuck 20 is adjusted, and the temperature of the workpiece W placed on the electrostatic chuck 20 is adjusted. In addition, the temperature adjustment unit HT may be provided inside the lower electrode 18.

In an embodiment, the temperature adjustment unit HT includes a plurality of heaters (a plurality of heating resistor elements) and a plurality of temperature sensors. The plurality of temperature sensors detects ambient temperatures of the plurality of heaters, respectively. The plurality of heaters is provided in a plurality of regions of the stage 14, respectively. The plurality of regions of the stage 14 is positioned directly under a plurality of regions ER of the workpiece W (to be described later), respectively, in a state where the workpiece W is placed on the electrostatic chuck 20. In the plasma processing apparatus 10, the temperatures of the plurality of respective regions ER of the workpiece W are adjusted by the plurality of heaters according to the temperatures of the plurality of regions ER that are measured by the plurality of temperature sensors.

The plasma processing apparatus 10 includes an upper electrode 30. The upper electrode 30 is provided above the stage 14. The upper electrode 30 is supported on the top portion of the chamber body 12 by a member 32. The member 32 is formed of an insulating material. The upper electrode 30 may include a ceiling plate 34 and a support body 36. The ceiling plate 34 faces the internal space 12s. A plurality of gas ejection holes 34a is provided in the ceiling plate 34. In an embodiment, the ceiling plate 34 contains silicon. In another embodiment, the ceiling plate 34 may contain silicon oxide.

The support body 36 is configured to support the ceiling plate 34 in a detachable manner. The support body 36 is a conductor and is formed of a metal such as aluminum. The support body 36 may have a water cooling structure. A gas diffusion chamber 36a is provided inside the support body 36. A plurality of gas flow holes 36b extends downward from the gas diffusion chamber 36a. The plurality of gas flow holes 36b communicates with the plurality of gas ejection holes 34a, respectively. A gas inlet port 36c is formed in the support body 36 to introduce a processing gas into the gas diffusion chamber 36a. A gas supply line 38 is connected to the gas inlet port 36c.

A gas source group 40 is connected to the gas supply line 38 via a valve group 42 and a flow rate controller group 44. The gas source group 40 has a plurality of gas sources. The plurality of gas sources is sources of a plurality of gases that are used in the method MT. The valve group 42 includes a plurality of valves, and the flow rate controller group 44 includes a plurality of flow rate controllers such as mass flow controllers. Each of the plurality of gas sources in the gas source group 40 is connected to the gas supply line 38 via a corresponding valve of the valve group 42 and a corresponding flow rate controller of the flow rate controller group 44.

In the plasma processing apparatus 10, a shield 46 is detachably provided along the inner wall of the chamber body 12. The shield 46 is also provided on the outer periphery of the support 13. The shield 46 prevents a byproduct of the plasma processing (e.g., an etching byproduct) from being attached to the chamber body 12. The shield 46 may be formed by coating a surface of, for example, an aluminum base material with ceramic such as, for example, $Y_2O_3$.

A baffle plate 48 is provided between the support 13 and the side wall of the chamber body 12 on the side of the bottom portion of the chamber body 12. The baffle plate 48 may be formed by coating a surface of, for example, an aluminum base material with ceramic such as, for example, $Y_2O_3$. An exhaust port 12e is provided below the baffle plate 48 in the chamber body 12. An exhaust device 50 is connected to the exhaust port 12e via an exhaust pipe 52. The exhaust device 50 is configured such that the space inside the chamber body 12 can be depressurized to a desired degree of vacuum. In an example, the exhaust device 50 includes an automatic pressure control valve and a vacuum pump. The vacuum pump includes, for example, a turbo molecular pump. A passage 12p is formed in the side wall of the chamber body 12. The workpiece W passes through the passage 12p when being carried between the internal space 12s and the outside of the chamber body 12. The passage 12p is openable and closable by a gate valve 12g. The gate valve 12g is provided along the side wall of the chamber body 12.

The plasma processing apparatus 10 further includes a first radio frequency power supply 62 and a second radio frequency power supply 64. The first radio frequency power supply 62 generates a first radio frequency wave. The first radio frequency wave is mainly used for the plasma generation. The first radio frequency wave has a frequency within the range of 27 MHz to 100 MHz. The frequency of the first radio frequency wave is, for example, 60 MHz. The first radio frequency power supply 62 is connected to the upper electrode 30 via a matching unit 66. The matching unit 66 has a circuit for matching the output impedance of the first radio frequency power supply 62 and the impedance of a load side (the side of the upper electrode 30) with each other. In addition, the first radio frequency power supply 62 may be connected to the lower electrode 18 via the matching unit 66.

The second radio frequency power supply 64 generates a second radio frequency wave. The second radio frequency wave has a frequency suitable for attracting ions to the workpiece W. The second radio frequency wave has a frequency within the range of 400 kHz to 40.68 MHz. The frequency of the second radio frequency wave is, for example, 13.56 MHz. The second radio frequency power supply 64 is connected to the lower electrode 18 via a matching unit 68. The matching unit 68 has a circuit for matching the output impedance of the second radio frequency power supply 64 and the impedance of a load side (the side of the lower electrode 18) with each other.

The plasma processing apparatus 10 further includes a power supply 70. The power supply 70 is connected to the upper electrode 30. The power supply 70 applies a voltage to the upper electrode 30. In an example, the power supply 70 is a DC power supply that generates a negative DC voltage. When the voltage from the power supply 70 is applied to the upper electrode 30, positive ions present inside the inner space 12s collide with the ceiling plate 34. As a result, secondary electrons and/or silicon are emitted from the ceiling plate 34.

The plasma processing apparatus 10 further includes a controller Cnt. The controller Cnt may be a computer device. The controller Cnt includes, for example, a processor, a storage device such as, for example, a memory, an input device such as, for example, a keyboard, a mouse, and/or a touch panel, and a display device. The processor of the controller Cnt executes a control program stored in the storage device, and controls each unit of the plasma processing apparatus 10 according to recipe data stored in the storage device. The controller Cnt controls each unit of the plasma processing apparatus 10 in the performance of the method MT.

Figure 4A:
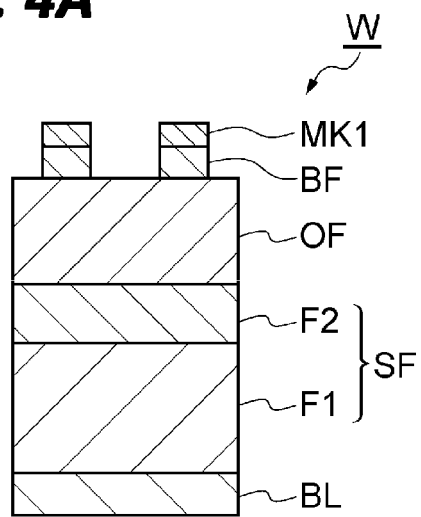
FIGS. 4A to 4D are enlarged cross-sectional views illustrating a portion of the workpiece obtained during the performance of the method MT.
Figure 4D:
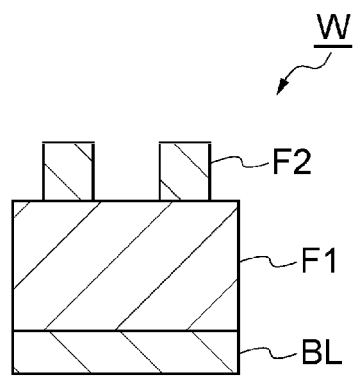
Figure 4B:
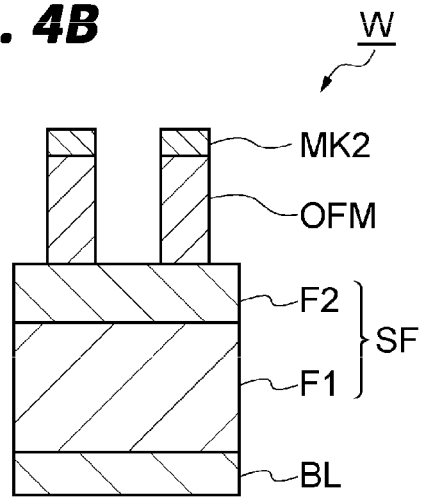
Figure 4E:
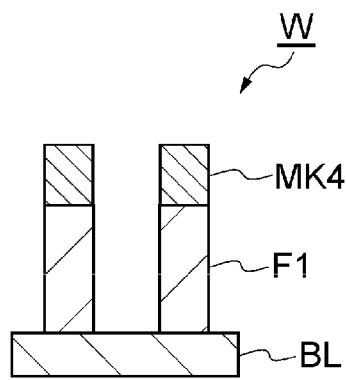
FIG. 4E is an enlarged cross-sectional view illustrating a portion of the workpiece in a state after the performance of the method MT.

Referring back to FIG. 1, the method MT will be described. Hereinafter, the method MT will be described assuming a case where the method MT is applied to the workpiece W illustrated in FIG. 2 using the plasma processing apparatus 10, as an example. However, the method MT may be performed using one or more plasma processing apparatuses other than the plasma processing apparatus 10. In addition, the workpiece to which the method MT is applied is not limited to the workpiece W illustrated in FIG. 2. Hereinafter, FIGS. 4A to 4E will also be referred to, along with FIG. 1. FIGS. 4A to 4D are enlarged cross-sectional views illustrating a portion of the workpiece obtained during the performance of the method MT, and FIG. 4E is an enlarged cross-sectional view illustrating a portion of the workpiece in a state after the performance of the method MT.

As illustrated in FIG. 1, step ST1 is performed in the method MT. In step ST1, the resist mask RM is modified. Specifically, in step ST1, a processing gas is supplied to the internal space 12s in a state where the workpiece W illustrated in FIG. 2 is placed on the stage 14. The processing gas used in step ST1 may be, for example, a mixture gas of hydrogen gas and rare gas. Further, in step ST1, the pressure of the internal space 12s is set to a specified pressure by the exhaust device 50. Further, in step ST1, the first radio frequency wave from the first radio frequency power supply 62 is supplied to the upper electrode 30. Further, in step ST1, the voltage from the power supply 70 is applied to the upper electrode 30. Further, in step ST1, the second radio frequency wave from the second radio frequency power supply 64 may or may not be supplied to the lower electrode 18. By the performance of step ST1, plasma of the processing gas is generated in the internal space 12s. The positive ions in the plasma collide with the ceiling plate 34 of the upper electrode 30. As a result, secondary electrons are emitted from the ceiling plate 34. The resist mask RM is modified by the emitted secondary electrons.

In the method MT, step ST2 is performed after the performance of step ST1. In step ST2, a plasma etching is performed to transfer a pattern of a mask MK1 to the antireflection film BF. The mask MK1 is the resist mask RM or the mask obtained by adjusting the width of the opening of the resist mask RM in step STR.

In step ST2, a processing gas is supplied to the internal space 12s in a state where the workpiece W having the mask MK1 is placed on the stage 14. The processing gas used in step ST2 may include, for example, fluorocarbon gas. Further, in step ST2, the pressure of the internal space 12s is set to a specified pressure by the exhaust device 50. Further, in step ST2, the first radio frequency wave from the first radio frequency power supply 62 is supplied to the upper electrode 30. Further, in step ST2, the second radio frequency wave from the second radio frequency power supply 64 is supplied to the lower electrode 18. By the performance of step ST2, plasma of the processing gas is generated in the internal space 12s. Then, the antireflection film BF is etched by active species such as ions and/or radicals in the plasma. As a result, as illustrated in FIG. 4A, the pattern of the mask MK1 is transferred to the antireflection film BF. After the performance of step ST2, the mask MK1 may be removed.

In the method MT, step ST3 is performed after the performance of step ST2. In step ST3, a plasma etching is performed in order to transfer a pattern of a mask MK2 to the organic film OF. The mask MK2 is a mask obtained from the antireflection film BF by the plasma etching in step ST2 or the mask obtained by adjusting the width of the opening of the mask obtained from the antireflection film BF in step STR.

In step ST3, a processing gas is supplied to the internal space 12s in a state where the workpiece W having the mask MK2 is placed on the stage 14. The processing gas used in step ST3 includes an oxygen-containing gas (e.g., oxygen gas). Alternatively, the processing gas used in step ST3 includes hydrogen gas and nitrogen gas. Further, in step ST3, the pressure of the internal space 12s is set to a specified pressure by the exhaust device 50. Further, in step ST3, the first radio frequency wave from the first radio frequency power supply 62 is supplied to the upper electrode 30. Further, in step ST3, the second radio frequency wave from the second radio frequency power supply 64 is supplied to the lower electrode 18. By the performance of step ST3, the plasma of the processing gas is generated in the internal space 12s. Then, the organic film OF is etched by active species such as ions and/or radicals in the plasma. As a result, as illustrated in FIG. 4B, the pattern of the mask MK2 is transferred to the organic film OF, so that an organic mask OFM is obtained from the organic film OF. After the performance of step ST3, the mask MK2 may be removed.

In the method MT, step ST4 is performed after the performance of step ST3. In step ST4, a plasma etching is performed in order to transfer a pattern of a mask MK3 to the second film F2. The mask MK3 is the organic mask OFM or the mask obtained by adjusting the width of the opening of the organic mask OFM in step STR.

Figure 4C:
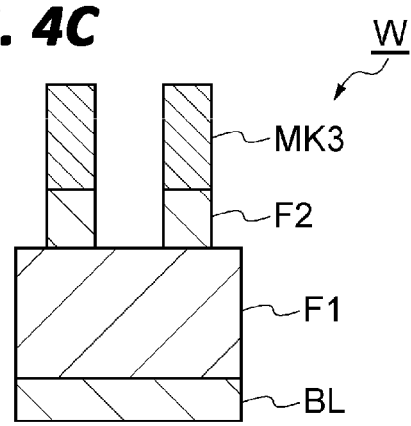

In step ST4, a processing gas is supplied to the internal space 12s in a state where the workpiece W having the mask MK3 is placed on the stage 14. The processing gas used in step ST4 may include fluorocarbon gas. Further, in step ST4, the pressure of the internal space 12s is set to a specified pressure by the exhaust device 50. Further, in step ST4, the first radio frequency power wave from the first radio frequency power supply 62 is supplied to the upper electrode 30. Further, in step ST4, the second radio frequency wave from the second radio frequency power supply 64 is supplied to the lower electrode 18. By the performance of step ST4, plasma of the processing gas is generated in the internal space 12s. Then, the second film F2 is etched by active species such as ions and/or radicals in the plasma. As a result, as illustrated in FIG. 4C, the pattern of the mask MK3 is transferred to the second film F2.

In the method MT, subsequently, step ST5 is performed. In step ST5, the mask MK3 is removed. In step ST5, a processing gas is supplied to the internal space 12s in a state where the workpiece W illustrated in FIG. 4C is placed on the stage 14. The processing gas used in step ST5 includes an oxygen-containing gas (e.g., oxide gas). Alternatively, the processing gas used in step ST5 includes hydrogen gas and nitrogen gas. Further, in step ST5, the pressure of the internal space 12s is set to a specified pressure by the exhaust device 50. Further, in step ST5, the first radio frequency wave from the first radio frequency power supply 62 is supplied to the upper electrode 30. Further, in step ST5, the second radio frequency wave from the second radio frequency power supply 64 may or may not be supplied to the lower electrode 18. By the performance of step ST5, plasma of the processing gas is generated in the internal space 12s. Then, the mask MK3, that is, the organic mask OFM itself or the mask including the organic mask OFM is removed by active species such as ions and/or radicals in the plasma. As a result, the workpiece W illustrated in FIG. 4D is obtained.

In the method MT, step ST6 is performed after the performance of step ST5. In step ST6, a plasma etching is performed to transfer a pattern of a mask MK4 to the first film F1. The mask MK4 is the mask obtained from the second film F2 by the plasma etching in step ST4 or the mask obtained by adjusting the width of the opening of the mask obtained from the second film F2 in step STR.

In step ST6, a processing gas is supplied to the internal space 12s in a state where the workpiece W having the mask MK4 is placed on the stage 14. The processing gas used in step ST6 may include a halogen-based gas. The processing gas used in step ST6 may include, for example, one or more of chlorine gas and hydrogen bromide gas. Further, in step ST6, the pressure of the internal space 12s is set to a specified pressure by the exhaust device 50. Further, in step ST6, the first radio frequency wave from the first radio frequency power supply 62 is supplied to the upper electrode 30. Further, in step ST6, the second radio frequency wave from the second radio frequency power supply 64 is supplied to the lower electrode 18. By the performance of step ST6, plasma of the processing gas is generated in the internal space 12s. Then, the first film F1 is etched by active species such as ions and/or radicals in the plasma. As a result, as illustrated in FIG. 4E, the pattern of the mask MK4 is transferred to the first film F1. In addition, a plasma etching may be performed to remove the oxide film formed on the surface of the first film F1, prior to the performance of step ST6. Fluorocarbon gas may be used for the plasma etching for the removal of the oxide film.

Figure 5:
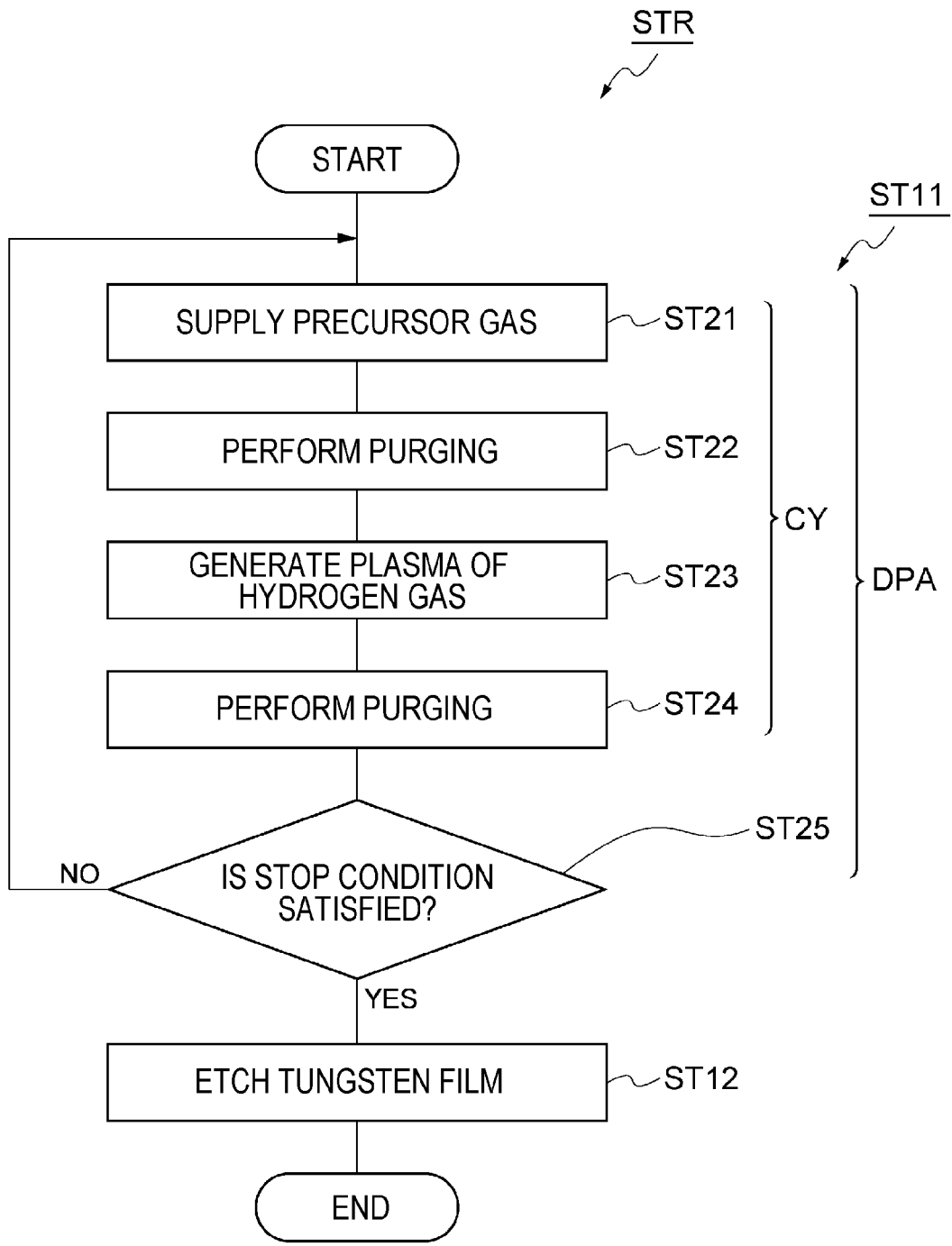
FIG. 5 is a flowchart illustrating an embodiment of step STR illustrated in FIG. 1.
Figure 7A:
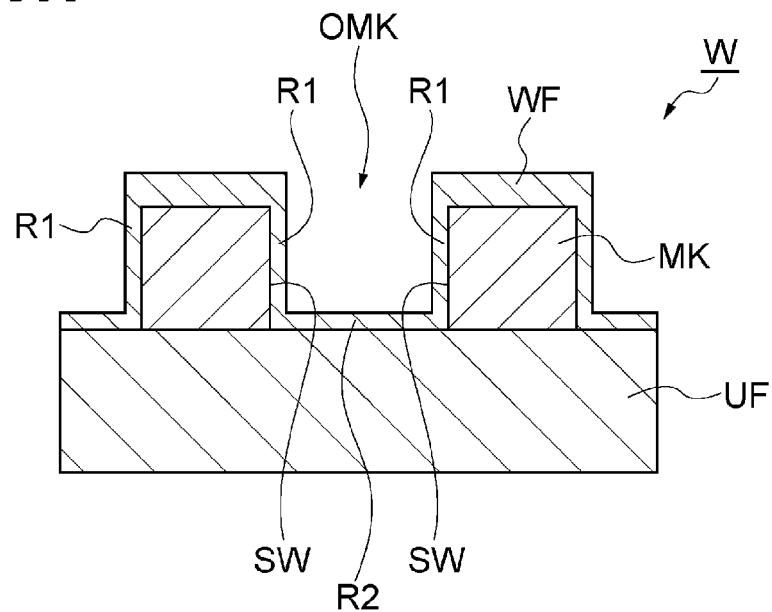
FIG. 7A is an enlarged cross-sectional view illustrating a portion of the workpiece after the formation of the tungsten film.
Figure 7B:
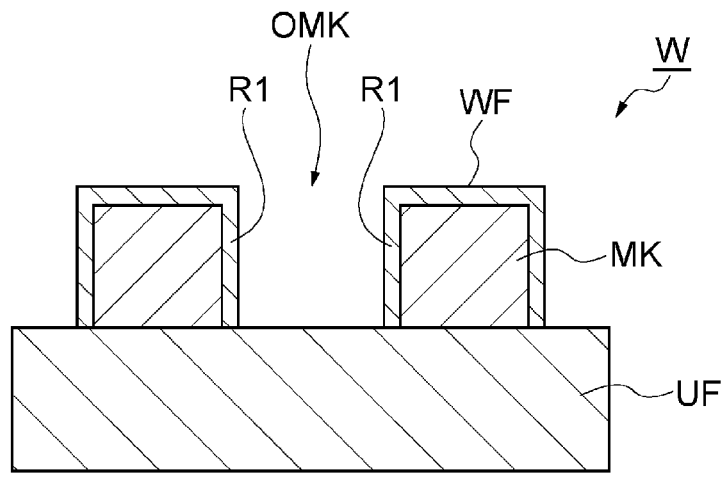
FIG. 7B is an enlarged cross-sectional view illustrating a portion of the workpiece in a state after the tungsten film is etched.

Hereinafter, step STR will be described with reference to FIGS. 5, 6, 7A, and 7B. FIG. 5 is a flowchart illustrating an embodiment of step STR illustrated in FIG. 1. FIG. 6 is a timing chart for the processing of forming a tungsten film. In FIG. 6, the horizontal axis represents time. In FIG. 6, the vertical axis represents a flow rate of a carrier gas, a flow rate of a precursor gas, a flow rate of hydrogen gas, and a state of the radio frequency wave. In FIG. 6, ON of the radio frequency wave indicates that at least the first radio frequency wave is being supplied for the plasma generation, and OFF of the radio frequency wave indicates that the supply of the first and second radio frequency waves is stopped. FIG. 7A is an enlarged cross-sectional view illustrating a portion of the workpiece in a state after the formation of the tungsten film, and FIG. 7B is an enlarged cross-sectional view illustrating a portion of the workpiece in a state after the etching of the tungsten film.

As described above, step STR is performed to adjust the width of the opening of the mask for the plasma etching in at least one of steps ST2, ST3, ST4, and ST6. That is, step STR is performed for at least one time period of the time period between the performance time period of step ST1 and the performance time period of step ST2, the time period between the performance time period of step ST2 and the performance time period of step ST3, the time period between the performance time period of step ST3 and the performance time period of step ST4, and the time period between the performance time period of step ST5 and the performance time period of step ST6.

In step STR, step ST11 is performed. In an embodiment of step ST11, a film formation processing DPA is performed to form a tungsten film on the workpiece W. By the performance of step ST11, as illustrated in FIG. 7A, a tungsten film WF is formed on the surface of the workpiece W, that is, the surface of the mask MK and the surface of the underlying film UF. The mask MK is the resist mask RM, the mask formed from the antireflection film BF by the performance of step ST2, the organic mask OFM, or the mask formed from the second film F2 by the performance of step ST4. When the mask MK is the resist mask RM, the underlying film UF is the antireflection film BF. When the mask MK is the mask formed from the antireflection film BF by the performance of step ST2, the underlying film UF is the organic film OF. When the mask MK is the organic mask OFM, the underlying film UF is the second film F2. When the mask MK is the mask formed from the second film F2 by the performance of step ST4, the underlying film UF is the first film F1.

In the film formation processing DPA, a cycle CY is performed once or more in order to form the tungsten film WF. Each cycle CY includes steps ST21 and ST23. In the film formation processing DPA, when the cycle CY is performed multiple times, steps ST21 and ST23 are alternately performed. In an embodiment, each cycle CY includes step ST22 which is performed between steps ST21 and ST23. In addition, each cycle CY includes step ST24 which is performed after step ST23.

In step ST21, a precursor gas is supplied to the workpiece W in order to deposit a precursor containing tungsten on the workpiece W. That is, the precursor gas is supplied to the internal space 12s of the chamber body 12. The precursor gas contains tungsten. The precursor gas may be a tungsten halide gas. In an example, the precursor gas is tungsten hexafluoride ($WF_6$) gas. The precursor gas may be another tungsten halide gas such as tungsten hexachloride gas or another tungsten-containing gas. In step ST21, no plasma is generated. That is, in step ST21, the supply of the first and second radio frequency waves is stopped.

In step ST21, a carrier gas may be supplied to the internal space 12s along with the precursor gas. The carrier gas may be a rare gas such as, for example, He gas, Ne gas, Ar gas, Xe gas, or Kr gas. In an embodiment, the carrier gas may be supplied to the internal space 12s throughout the performance time period of the film formation processing DPA as illustrated in FIG. 6. In step ST21, the flow rate of the precursor gas may be set to 100 sccm or more and 300 sccm or less. In step ST21, the flow rate of the carrier gas may be set to 0 sccm or more and 3,000 sccm or less. In addition, in step ST21, the pressure of the internal space 12s may be set to 0.02 Torr (2.6 Pa) or more and 3 Torr (400 Pa) or less.

In subsequent step ST22, the internal space 12s is purged. Specifically, in step ST22, the internal space 12s is exhausted. In step ST22, the carrier gas may be supplied as a purging gas to the internal space 22s. By the performance of step ST22, the precursor gas of the internal space 12s is discharged, and the precursor excessively deposited on the workpiece W is removed.

In subsequent step ST23, plasma of hydrogen gas ($H_2$ gas) is generated in the internal space 12s in order to supply active species of hydrogen to the precursor on the workpiece W. In order to generate plasma of hydrogen gas in step ST23, as illustrated in FIG. 6, the supply of hydrogen gas to the internal space 12s is started after the performance of step ST22 and prior to the performance of step ST23. After predetermined time elapses from the start of the supply of hydrogen gas, the performance of step ST23 is started. The supply of hydrogen gas continues until step ST23 is ended. The carrier gas may also be supplied to the internal space 12s while the hydrogen gas is being supplied to the internal space 12s.

In step ST23, the first radio frequency wave is supplied to the lower electrode 18 (or the upper electrode 30) in a state where the hydrogen gas is being supplied to the internal space 12s. As a result, plasma of the hydrogen gas is generated in the internal space 12s. In step ST23, the second radio frequency wave may be supplied to the lower electrode 18. In step ST23, impurities in the precursor are removed by active species of hydrogen, that is, ions and/or radicals of hydrogen obtained from the plasma. When the precursor gas is tungsten halide gas, halogen elements are removed from the precursor by a reaction between the halogen elements in the precursor and hydrogen.

In step ST23, the flow rate of the hydrogen gas may be set to 100 sccm or more and 3,000 sccm or less. In step ST23, the flow rate of the carrier gas may be set to 0 sccm or more and 3,000 sccm or less. In step ST23, the pressure of the internal space 12s may be set to 0.02 Torr (2.6 Pa) or more and 3 Torr (400 Pa) or less. In step ST23, the power of the first radio frequency wave may be set to 20 W or more and 3,000 W or less. In addition, in step ST23, the power of the second radio frequency wave may be set to 0 W or more and 200 W or less.

In subsequent step ST24, the internal space 12s is purged. Specifically, in step ST24, the internal space 12s is exhausted. In step ST24, the carrier gas may be supplied as a purging gas to the internal space 12s. By the performance of step ST24, the hydrogen gas in the internal space 12s is discharged.

In subsequent step ST25, it is determined whether a stop condition is satisfied. The stop condition is determined to be satisfied when the number of performance times of the cycle CY reaches a predetermined number of times. The predetermined number of times is one or more times. When it is determined in step ST25 that the stop condition is not satisfied, the cycle CY is performed again. Meanwhile, when it is determined in step ST25 that the stop condition is satisfied, the performance of the film formation processing DPA is stopped. By the performance of the film formation processing DPA, as illustrated in FIG. 7A, the tungsten film WF is formed on the surface of the workpiece W. The tungsten film WF includes a first region R1 and a second region R2. The first region R1 extends along the side wall surface SW of the mask MK that defines the opening OMK. The second region R2 extends on the underlying film UF.

In an embodiment, the temperature of the workpiece W during the performance of the film formation processing DPA in step ST11 is substantially uniform across the entire regions of the workpiece W, and is set to, for example, 0° C. or lower. In another embodiment, the temperature of the workpiece W during the performance of the film formation processing DPA in step ST11 is set to, for example, −20° C. or lower.

As illustrated in FIG. 5, subsequently, step ST12 is performed in step STR. In step ST12, a plasma etching of the tungsten film WF is performed to remove the second region R2 while leaving the first region R1. In step ST12, a processing gas is supplied to the internal space 12s in a state where the workpiece W in the state illustrated in FIG. 7A is placed on the stage 14. The processing gas used in step ST12 may include fluorocarbon gas. Further, in step ST12, the pressure of the internal space 12s is set to a specified pressure by the exhaust device 50. Further, in step ST12, the first radio frequency wave from the first radio frequency power supply 62 is supplied to the upper electrode 30. In step ST12, an anisotropic plasma etching is performed to selectively remove the second region R2 while leaving the first region R1. Accordingly, in step ST12, the second radio frequency wave from the second radio frequency power supply 64 is supplied to the lower electrode 18. By the performance of step ST12, plasma of the processing gas is generated in the internal space 12s. Then, ions in the plasma are attracted to the workpiece W so that the second region R2 is etched. As a result, as illustrated in FIG. 7B, the first region R1 of the tungsten film WF is left and the second region R2 is etched. Further, the tungsten film WF extending on the upper surface of the mask MK is removed, or its film thickness is reduced.

In the method MT of the embodiment described above, the precursor is deposited (step ST21), and the impurities in the precursor are removed by active species of hydrogen (step ST23), so that the tungsten film WF is formed on the surfaces of the mask MK and the underlying film UF. Then, in step ST12, the tungsten film WF is etched such that the first region R1 is left. As a result, the width of the opening OMK of the mask MK is adjusted. In addition, since the first region R1 made of tungsten is provided along the side wall surface SW of the mask MK, a mask MKi ("i" is any one integer of 1 to 4) which is more rigid against the plasma etching of the underlying film UF is provided. Further, the roughness of the side wall surface of the mask MK is improved by the first region R1 made of tungsten. However, in forming a tungsten film according to an ALD method that does not use plasma, the temperature of the workpiece is generally set to, 250° C. or higher in order to cause the reaction for removing the impurities in the precursor. Meanwhile, in the method MT, the impurities in the precursor are removed by active species of hydrogen obtained from the plasma of the hydrogen gas so that the tungsten film WF is formed. Thus, the temperature of the workpiece W during the performance of the film formation processing DPA in step ST11 may be set to a low temperature.

Figure 8:
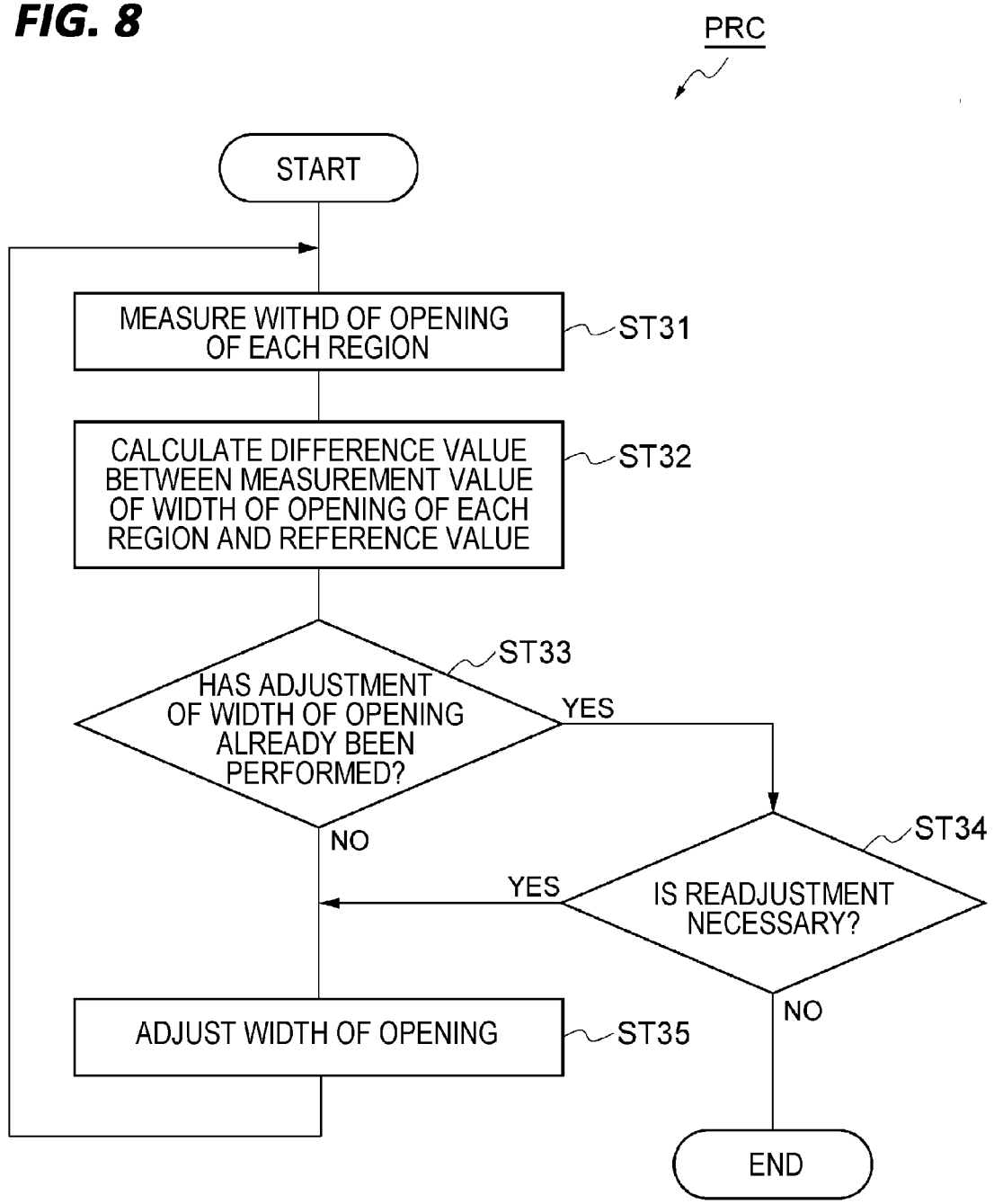
FIG. 8 is a flowchart illustrating another processing that may be performed in step ST11 illustrated in FIG. 5.
Figure 9:
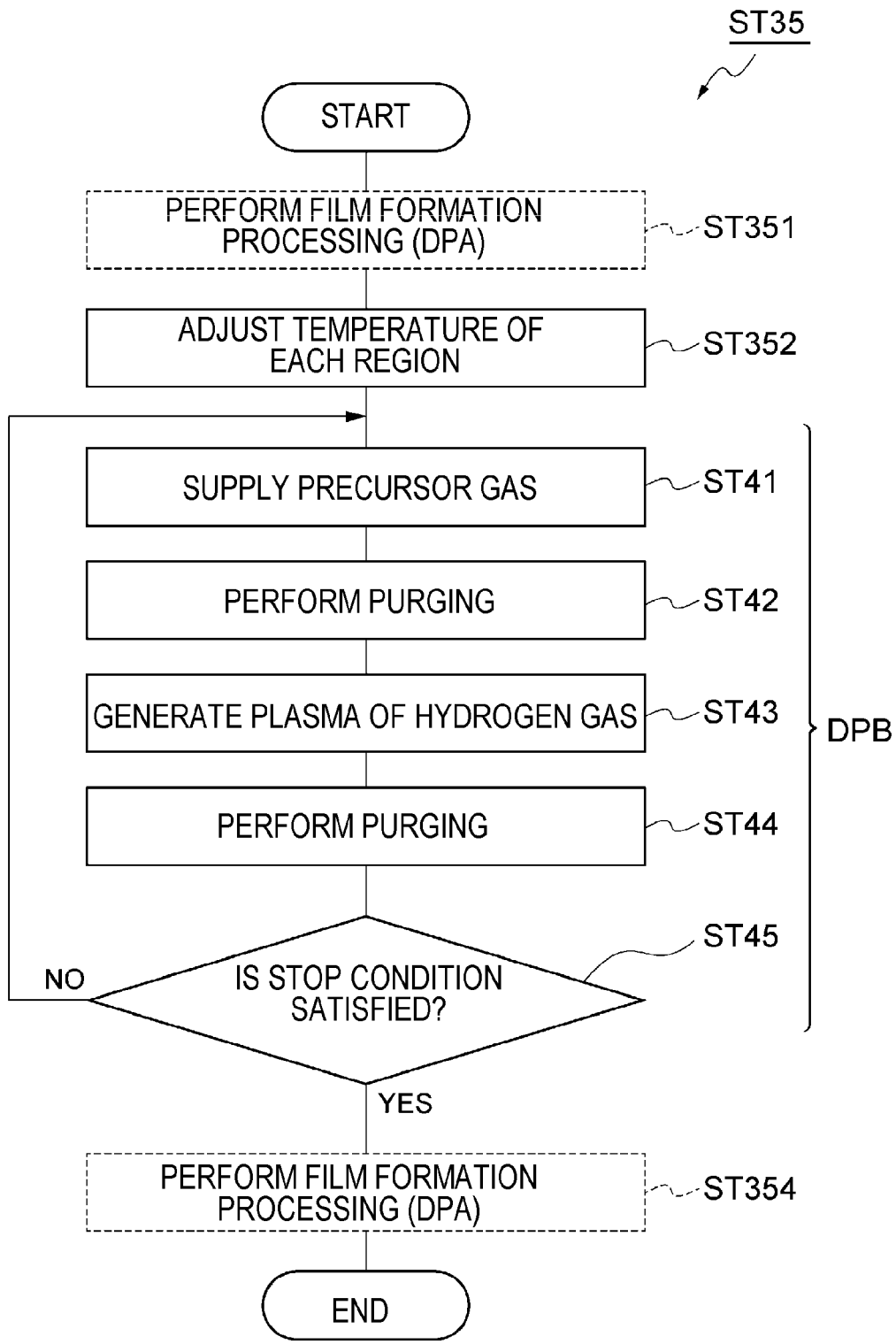
FIG. 9 is a flowchart illustrating step ST35 included in the processing illustrated in FIG. 8.
Figure 10:
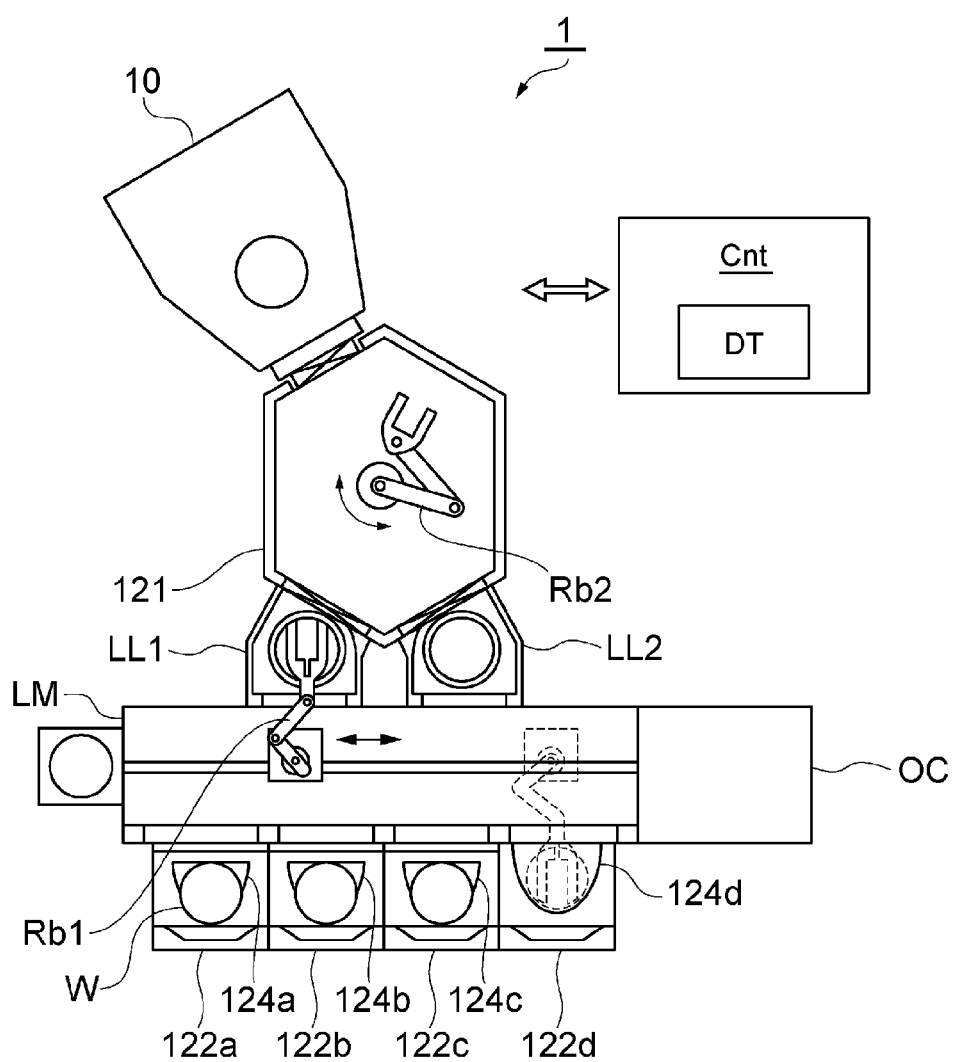
FIG. 10 is a view schematically illustrating a processing system that is usable when the processing illustrated in FIG. 8 are performed in the method illustrated in FIG. 1.

Hereinafter, another processing that may be performed in step ST11 will be described. FIG. 8 is a flowchart illustrating another processing that may be performed in step ST11 illustrated in FIG. 5. FIG. 9 is a flowchart illustrating step ST35 included in the processing illustrated in FIG. 8. FIG. 10 is a view schematically illustrating a processing system that is usable when the processing illustrated in FIG. 8 is performed in the method illustrated in FIG. 1. When the processing PRC illustrated in FIG. 8 is performed in step ST11, the processing system 1 illustrated in FIG. 10 may be used in the method MT.

The processing system 1 includes tables 122a, 122b, 122c, and 122d, containers 124a, 124b, 124c, and 124d, a loader module LM, load lock modules LL1 and LL2, a transfer module 121, and the plasma processing apparatus 10 described above.

The tables 122a to 122d are arranged along one edge of the loader module LM. The containers 124a to 124d are provided on the tables 122a to 122d, respectively. The workpiece W may be accommodated in each of the containers 124a to 124d. Each of the containers 124a to 124d is, for example, a container called a FOUP (front-opening unified pod).

The loader module LM provides a chamber. A transfer robot Rb1 is provided inside the chamber of the loader module LM. The transfer robot Rb1 is configured to transfer the workpiece W between any one of the containers 124a to 124d and a preliminary decompression chamber of any one of the load lock modules LL1 and LL2, between the preliminary decompression chamber of any one of the load lock modules LL1 and LL2 and an optical observation apparatus OC, and between the optical observation apparatus OC and any one of the containers 124a to 124d.

The load lock modules LL1 and LL2 are provided along another edge of the loader module LM and connected to the loader module LM. Each of the load lock modules LL1 and LL2 provides a preliminary decompression chamber. Each of the load lock modules LL1 and LL2 is connected to the transfer module 121.

The transfer module 121 provides a chamber that can be depressurized. A transfer robot Rb2 is provided inside the chamber of the transfer module 121. The plasma processing apparatus 10 is connected to the transfer module 121. The transfer robot Rb2 is configured to transfer the workpiece W between the preliminary decompression chamber of any one of the load lock modules LL1 and LL2 and the internal space 12s.

The processing system 1 further includes the optical observation apparatus OC. The workpiece W can be moved between the optical observation apparatus OC and the plasma processing apparatus 10 by the transfer robots Rb1 and Rb2. After the workpiece W is accommodated in the optical observation apparatus OC by the transfer robot Rb1 and positioned inside the optical observation apparatus OC, the optical observation apparatus OC measures the width of the opening of the mask of the workpiece W. Specifically, the optical observation apparatus OC measures the width of the opening of the mask in each of the plurality of regions ER of the workpiece W, and transmits the measurement value of the width of the opening of the mask to the controller Cnt. The controller Cnt controls the respective units of the processing system 1, in addition to the respective units of the plasma processing apparatus 10. Correspondence data DT to be described later is stored to be readable in the storage unit of the controller Cnt.

Figure 11:
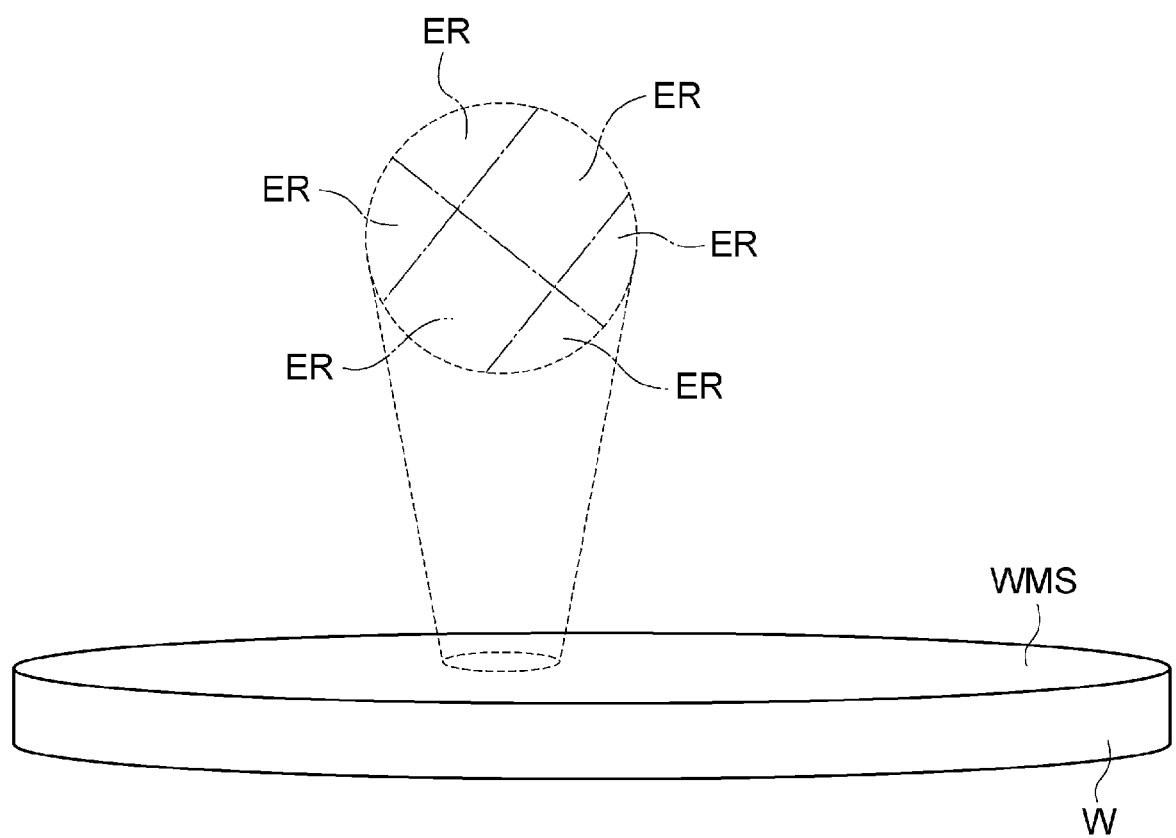
FIG. 11 is a view illustrating an example of a part of a plurality of regions of the workpiece.

FIGS. 8 and 9 will be referred to again. The processing PRC includes steps ST31 to ST35. Step ST35 may be performed multiple times according to determination results in steps ST33 and ST34. In step ST31, the measurement value of the width of the opening of the mask MK in each of the plurality of regions ER of the workpiece W is acquired by the optical observation apparatus OC of the processing system 1. FIG. 11 is a view illustrating a part of the plurality of regions of the workpiece. The plurality of regions ER defines the main surface WMS of the workpiece W. The main surface WMS includes the surface of the mask MK and the upper surface of the underlying film UF exposed from the mask MK. The plurality of regions ER does not overlap with each other. The plurality of regions ER may include one or more regions each having a plurality of regions which are concentric with the central axis of the workpiece W. Alternatively, the plurality of regions ER may be a plurality of regions which defines the main surface of the workpiece W in a lattice shape. The layout of the plurality of regions ER may not be limited.

In step ST32 subsequent to step ST31, a positive difference value between the measurement value acquired for each of the plurality of regions in step ST31 and a reference value is calculated. In subsequent step ST33, it is determined whether the adjustment of the width of the opening of the mask MK has already been performed. Specifically, when step ST35 has already been performed in the processing PRC, it is determined that the adjustment of the width of the opening of the mask MK was performed once. In step ST33, when it is determined that the adjustment of the width of the opening of the mask MK has not yet been performed, the processing proceeds to step ST35. In step ST33, when it is determined that the adjustment of the width of the opening of the mask MK has already been performed, the processing proceeds to step ST34.

In step ST34, it is determined whether a readjustment of the width of the opening of the mask MK is necessary, based on the difference value calculated in step ST32. In step ST34, when each difference value is larger than a predetermined value, it is determined that the readjustment of the width of the opening of the mask MK is necessary. When it is determined in step ST34 that the readjustment of the width of the opening of the mask MK is necessary, the processing proceeds to step ST35. When it is determined in step ST34 that the readjustment of the width of the opening of the mask MK is unnecessary, the processing PRC is ended.

In step ST35, the width of the opening of the mask MK is adjusted. Specifically, in step ST35, the workpiece W is carried into the internal space 12s of the plasma processing apparatus 10 from the optical observation apparatus OC by the transfer robots Rb1 and Rb2. Then, the tungsten film WF is formed on the surface of each of the plurality of regions ER so as to make the width of the opening of the mask MK in each of the plurality of regions ER conform to or approach the reference value described above. The formation of the tungsten film in step ST35 will be described later. Subsequently, the workpiece W is moved from the internal space 12s into the optical observation apparatus OC by the transfer robots Rb1 and Rb2. Then, the processing starting from step ST31 is performed again.

As illustrated in FIG. 9, step ST351 may be performed in the formation of the tungsten film in step ST35. In step ST351, the film formation processing DPA described above may be performed. By the film formation processing DPA, the film of tungsten can be relatively uniformly formed. In addition, step ST351 may not be performed.

In subsequent step ST352, the temperature of the workpiece W is adjusted for each of the plurality of regions ER by using the temperature adjustment unit HT (the plurality of heaters described above). In step ST352, correspondence data DT is used. The correspondence data DT specifies a relationship between the temperature of the workpiece W and the film thickness of the tungsten film deposited on the workpiece W, and is acquired in advance. In step ST352, for each of the plurality of regions ER, a temperature associated with a film thickness corresponding to the above-described difference value is specified by referring to the correspondence data DT. In a case where the film formation processing DPA is not performed in step ST35, for each of the plurality of regions ER, a temperature associated with a film thickness corresponding to a half of the above-described difference value is specified in step ST352 by referring to the correspondence data DT. In a case where the film formation processing DPA is performed in step ST35, for each of the plurality of regions ER, a temperature associated with a film thickness obtained by subtracting the film thickness of the tungsten film formed in the film formation processing DPA of step ST35 from the film thickness corresponding to the half of the above-described difference value is specified in step ST352 by referring to the correspondence data DT. The temperature of each region ER is adjusted to the specified temperature.

In step ST35, subsequently, a film formation processing DPB is performed. In the film formation processing DPB, a cycle including steps ST41 to ST44 is performed once or more. Steps ST41 to ST44 are the same as steps ST21 to ST24, respectively. However, while the temperatures of the plurality of regions RE of the workpiece in step ST21 (i.e., the film formation processing DPA) are substantially the same, the temperatures of the plurality of regions ER in step ST41 (i.e., the film formation processing DPB) are the temperatures individually adjusted in step ST352. As the temperature of each region RE is low, the film thickness of the tungsten film formed on the region RE by the film formation processing DPB is thick. In addition, the processing time length of step ST41 is within the range of the time length in which the thickness of the precursor film formed on the workpiece W in step ST41 becomes a state of increasing/decreasing according to the temperature of the workpiece W. This processing time length is shorter than the time length for reaching a self-limited region of the atomic layer deposition method. Further, in the processing time length for reaching the self-limited region, the thickness of a film to be formed does not rely on the temperature of the workpiece W.

In the film formation processing DPB, step ST45 is performed subsequent to step ST44. In step ST45, it is determined whether a stop condition is satisfied. In step ST45, it is determined that the stop condition is satisfied when the number of performance times of the cycle including steps ST41 to ST44 reaches a predetermined number of times. When the stop condition is not satisfied, the cycle including step ST41 to ST44 is performed again. Meanwhile, when the stop condition is satisfied, the processing proceeds to step ST354. In step ST354, the film formation processing DPA described above is performed. The film formation processing DPA of step ST354 may not be performed.

According to the processing PRC, even when the widths of the openings of the mask MK in the plurality of regions ER are different from each other, it is possible to adjust the widths of the openings of the mask MK so as to reduce or eliminate the difference of the widths of the openings of the mask MK in the plurality of regions ER.

While various embodiments have been described, the present disclosure are not limited to the embodiments described above and may be configured in various modifications. For example, the plasma processing apparatus used for performing the method MT may be an inductively coupled plasma processing apparatus or any other plasma processing apparatus such as, for example, a plasma processing apparatus using surface waves such as, for example, microwaves for the generation of plasma. In addition, the processing system 1 may include one or more plasma processing apparatuses, in addition to the plasma processing apparatus 10. That is, the processing system 1 may include a plurality of plasma processing apparatuses connected to the transfer module 121. Each of steps ST1 to ST6 and STR may be performed using a plasma processing apparatus of the processing system 1 which is different from plasma processing apparatuses of the processing system 1 used in the other steps. Alternatively, some of steps ST1 to ST6 and STR may be performed using one plasma processing apparatus of the processing system 1, and one or more of the other steps may be performed using one or more other plasma processing apparatuses of the processing system 1.

Hereinafter, descriptions will be made on experiments conducted for an evaluation of the film formation processing of the method MT. In the experiments, the tungsten film was formed on the underlying film of multiple samples by performing the film formation processing DPA using the plasma processing apparatus 10. In the experiments, the processing time of step ST21 and the number of performance times of the cycle in the film formation processing DPA were set to be different from each other as variable parameters. The experimental conditions are described below.

Figure 12:
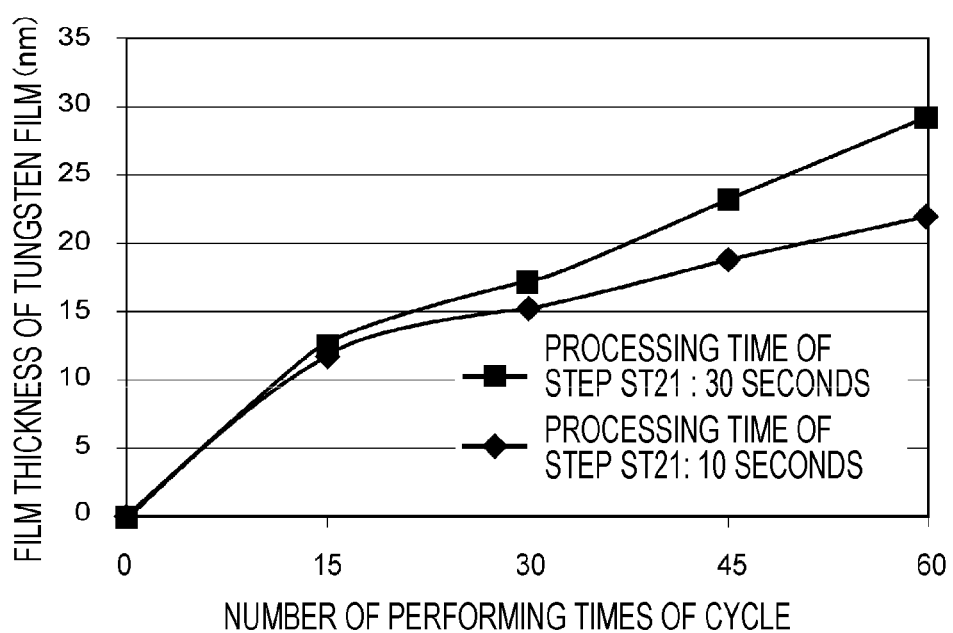
FIG. 12 is a graph representing an experimental result.

<Experimental Conditions>
Step ST21
  Pressure of internal space 12s: 800 mTorr (107 Pa)
  Flow rate of $WF_6$ gas: 170 sccm
  Flow rate of carrier gas (Ar gas): 600 sccm
  Processing time: 10 seconds or 30 seconds
Step ST22
  Pressure of internal space 12s: 800 mTorr (107 Pa)
  Flow rate of carrier gas (Ar gas): 800 sccm
  Processing time: 30 seconds
Step ST23
  Pressure of internal space 12s: 800 mTorr (107 Pa)
  Flow rate of $H_2$ gas: 500 sccm
  Flow rate of carrier gas (Ar gas): 600 sccm
  First radio frequency wave: 100 MHz, 500 W
  Second radio frequency wave: 0 W
  Processing time: 3 seconds
Step ST24
  Pressure of internal space 12s: 800 mTorr (107 Pa)
  Flow rate of carrier gas (Ar gas): 800 sccm
  Processing time: 30 seconds In the experiments, the film thickness of the tungsten film formed on the underlying film of each sample was measured. FIG. 12 represents the result. In the graph of FIG. 12, the horizontal axis represents the number of performance times of the cycle CY, and the vertical axis represents the film thickness of the tungsten film. As represented in FIG. 12, the film thickness of the tungsten film increased along with the number of performance times of the cycle. From this result, it was confirmed that the film thickness of the tungsten film is controllable according to the number of performance times of the cycle including the alternate supply of the tungsten-containing precursor gas and the active species of hydrogen. Thus, it was confirmed that the width of the opening of the mask MK is arbitrarily controllable according to the method MT.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of processing a workpiece, the method comprising:
    preparing a workpiece including an underlying film and a mask having an opening provided on the underlying film;
    forming, on the workpiece, a tungsten film including a first region that extends along a side wall surface of the mask that defines the opening, and a second region that extends on the underlying film;
    performing a plasma etching of the tungsten film to remove the second region while leaving the first region, and
    performing an etching of the underlying film using the mask and the tungsten film left on the first region,
    wherein the forming the tungsten film includes:
    supplying a tungsten-containing precursor gas to the workpiece in order to deposit a tungsten-containing precursor on the workpiece; and
    generating plasma from hydrogen gas in order to supply hydrogen active species to the precursor on the workpiece.

2. The method of claim 1, wherein in the forming the tungsten film, a cycle including the supplying a precursor gas and the generating plasma from hydrogen gas is performed a plurality of times.

3. The method of claim 1, wherein the precursor gas is tungsten halide gas.

4. The method of claim 1, wherein the precursor gas may be tungsten hexafluoride gas.

5. A method of processing a workpiece, the method comprising:
    preparing a workpiece including an underlying film and a mask having an opening provided on the underlying film;
    forming, on the workpiece, a tungsten film including a first region that extends along a side wall surface of the mask that defines the opening, and a second region that extends on the underlying film; and
    performing a plasma etching of the tungsten film to remove the second region while leaving the first region,
    wherein the forming the tungsten film includes:
    supplying a tungsten-containing precursor gas to the workpiece in order to deposit a tungsten-containing precursor on the workpiece; and
    generating plasma from hydrogen gas in order to supply hydrogen active species to the precursor on the workpiece,
    wherein the workpiece includes a silicon-containing film, an organic film provided on the silicon-containing film, an antireflection film containing silicon and provided on the organic film, and a resist mask provided on the antireflection film,
    the silicon-containing film has a first film formed of silicon and a second film formed of silicon oxide and provided on the first film,
    the underlying film is the antireflection film, and the mask provided on the underlying film is the resist mask, and
    the method further includes:
    after the performing the plasma etching of the tungsten film,
    performing a plasma etching of the antireflection film;
    performing a plasma etching of the organic film to form an organic mask from the organic film;
    performing a plasma etching of the second film;
    removing the organic mask; and
    performing a plasma etching of the first film.

6. The method of claim 5, wherein
    the forming the tungsten film and the performing the plasma etching of the tungsten film are performed between the removing the organic mask and the performing the plasma etching of the first film.

* * * * *